US009048123B2

(12) United States Patent
Erickson et al.

(10) Patent No.: US 9,048,123 B2
(45) Date of Patent: Jun. 2, 2015

(54) INTERDIGITATED FINFETS

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/031,202

(22) Filed: Sep. 19, 2013

(65) Prior Publication Data

US 2015/0076615 A1    Mar. 19, 2015

(51) Int. Cl.
  *H01L 27/11*   (2006.01)
  *H01L 21/8238*  (2006.01)
  *H01L 27/092*  (2006.01)

(52) U.S. Cl.
  CPC .... *H01L 27/0924* (2013.01); *H01L 21/823821* (2013.01)

(58) Field of Classification Search
  CPC .................. H01L 27/0924; H01L 21/823821
  USPC ......................................... 257/347, 354, 390
  See application file for complete search history.

(56) References Cited

U.S. PATENT DOCUMENTS

| | | | |
|---|---|---|---|
| 7,368,354 B2 | 5/2008 | Anderson et al. | |
| 7,473,605 B2 | 1/2009 | Anderson et al. | |
| 7,858,481 B2 | 12/2010 | Brask et al. | |
| 7,915,682 B2 | 3/2011 | Hsu et al. | |
| 7,994,583 B2 * | 8/2011 | Inaba | 257/369 |
| 8,809,963 B2 * | 8/2014 | Liaw | 257/390 |
| 2009/0057780 A1 * | 3/2009 | Wong et al. | 257/401 |
| 2013/0026571 A1 * | 1/2013 | Kawa et al. | 257/347 |
| 2013/0210211 A1 * | 8/2013 | Vereen et al. | 438/382 |
| 2014/0001562 A1 * | 1/2014 | Liaw | 257/369 |

OTHER PUBLICATIONS

Anonymous, "Novel Enhanced Current Density FinFET Structure and Apparatus", IP.Com Prior Art Technical Disclosure, IP.Com No. IPCOM000223876D, Dec. 4, 2012.
Ernst et al., "A 3D Stacked Nanowire Technology—Applications in Advanced CMOS and Beyond", CEA/LETI, Minatec, France, pp. 1-30, copyright: CEA-LETI.
Ernst et al., "Novel 3D Integration Process for Highly Scalable Nano-Beam Stacked-Channels GAA (NBG) FinFETs with HfO2/TiN Gate Stack", Conference Paper, 2006 International Electron Devices Meeting, 2006.

* cited by examiner

*Primary Examiner* — William D Coleman
(74) *Attorney, Agent, or Firm* — Richard A. Wilhelm; Robert R. Williams

(57) ABSTRACT

A semiconductor device includes a first fin rising out of a semiconductor base. It further includes a second fin rising out of the semiconductor base. The second fin is substantially parallel to the first fin that forms a span between the first fin and the second fin. A first dielectric layer is deposited on exposed surfaces of a first gate body area of the first fin, a second gate body area of the second fin, and an adjacent surface of the semiconductor base that defines the span between the first and second gate body areas. A gate electrode layer is sandwiched between the first dielectric layer and a second dielectric layer. The semiconductor device includes a third fin interdigitated between the first fin and the second fin within the span. Exposed surfaces of the gate body area of the third fin are in contact with the second dielectric layer.

20 Claims, 10 Drawing Sheets

INTERDIGITATED FINFETS

FIELD

This invention relates generally to semiconductor devices, and more specifically to finFETs.

BACKGROUND

A semiconductor device is a component of most electronic systems. Field effect transistors (FETs) have been the dominant semiconductor technology used to make application specific integrated circuit (ASIC) devices, microprocessor devices, static random access memory (SRAM) devices, and the like, for many years. In particular, complementary metal oxide semiconductor (CMOS) technology has dominated the semiconductor process industry.

Technology advances have scaled FETs on semiconductor devices to small dimensions allowing power per logic gate to be dramatically reduced, and further allowing a very large number of FETs to be fabricated on a single semiconductor device. However, traditional FETs are reaching their physical limitations as their size decreases. To address this problem finFETs are a recent development. FinFETs use three-dimensional techniques to pack a large number of FETs in a very small area.

SUMMARY

In an embodiment, a semiconductor device is described and a method of making the same. The semiconductor device includes a first fin rising out of a semiconductor base. The semiconductor device further includes a second fin rising out of the semiconductor base. The second fin is substantially parallel to the first fin that forms a span between the first fin and the second fin. A first dielectric layer is deposited on exposed surfaces of a first gate body area of the first fin, a second gate body area of the second fin, and an adjacent surface of the semiconductor base that defines the span between the first and second gate body areas. A gate electrode layer sandwiched between the first dielectric layer and a second dielectric layer. The semiconductor device includes a third fin interdigitated between the first fin and the second fin within the span. Exposed surfaces of the gate body area of the third fin are in contact with the second dielectric layer.

BRIEF DESCRIPTION OF THE DRAWINGS

Embodiments will be better understood from the following detailed description with reference to the drawings, in which:

FIG. 1 illustrates an isometric view of a semiconductor device having two parallel fins, a first gate dielectric, a gate electrode, and a second gate dielectric fabricated by known techniques, according to an embodiment.

FIG. 2 illustrates an isometric view of the semiconductor device after a mask and an etch to define a gate length, according to an embodiment.

FIG. 3 illustrates an isometric view of the semiconductor device where the source and drain regions of the parallel fins are defined, according to an embodiment.

FIG. 4 illustrates an isometric view of the semiconductor device after a spacer dielectric is deposited on the surfaces of the semiconductor device, according to an embodiment FIG. 5 illustrates an isometric view of the semiconductor device after an etch of the spacer on the horizontal surfaces, according to an embodiment.

FIG. 6 illustrates an isometric, cutaway view of the semiconductor device after epitaxially growing semiconductor material off of the exposed parallel fin surfaces, according to an embodiment.

FIG. 7 illustrates an isometric, cutaway view of the semiconductor device after removal of dielectric between the semiconductor materials, which was epitaxially grown, forming a trench, according to an embodiment.

FIG. 8 illustrates an isometric, cutaway view of the semiconductor device after an epitaxial growth of semiconductor material in the trench forming an interdigitated finFET, according to an embodiment.

DETAILED DESCRIPTION

Figure 1:
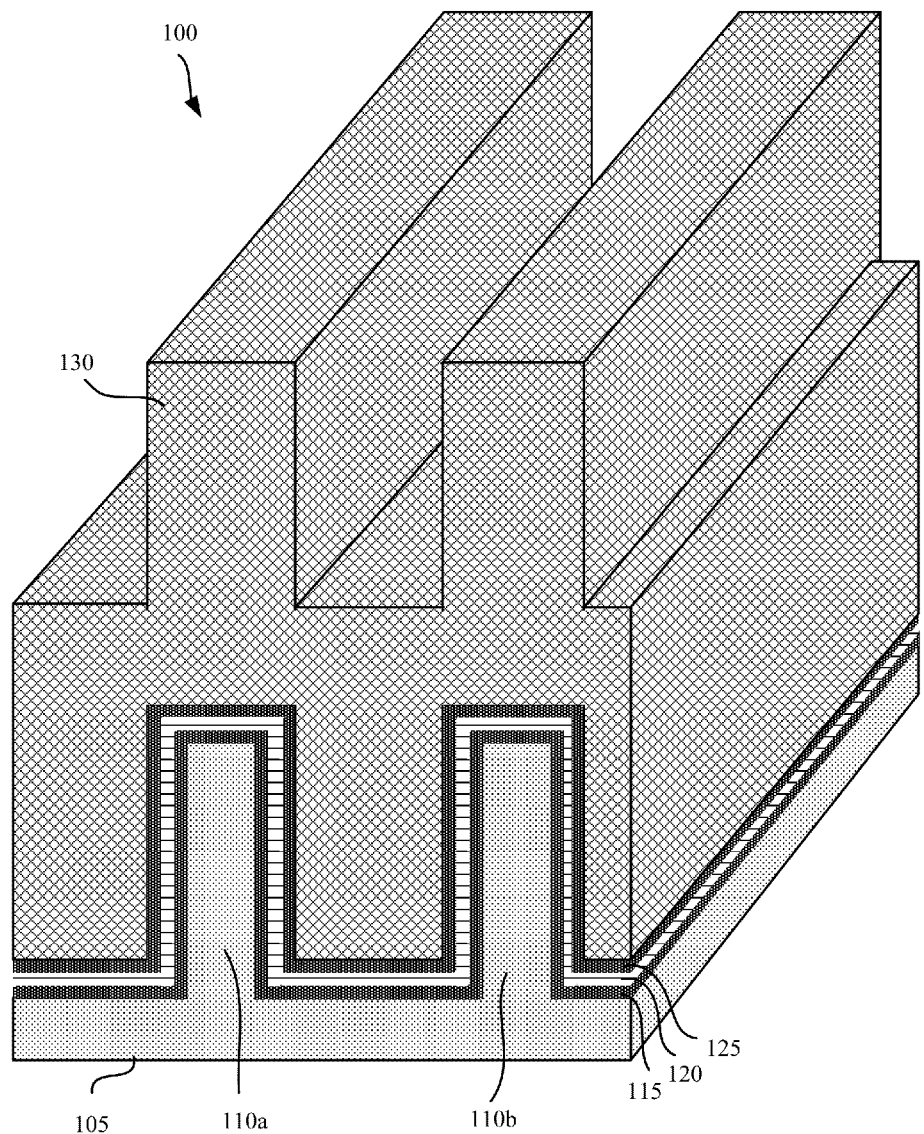
FIGS. 1-8 illustrate sequential isometric view of a process for creating an exemplary semiconductor device, according to an embodiment.

Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

The production of traditional field effect transistors (FETs) is currently running into physical barriers when creating small, fast semiconductor devices. Gate oxides have become thin enough that current leakage occurs through the gate oxides. Further thinning of gate oxide thickness will bring an exponential increase in current leakage. Power dissipated by current leakage has become a significant portion of total device power, and an exponential increase in current leakage may result in unacceptable power dissipation for many types of devices.

Silicon on insulator (SOI) processes that have been introduced have reduced FET source and drain capacitances, resulting in an improved power/performance ratio for CMOS devices fabricated in an SOI process. However, conventional SOI processes are also reaching fundamental limits, resulting in undesirable effects such as the current leakage effects mentioned above. Therefore, innovative ways to make CMOS devices are being created such as finFETs.

A finFET is a FET device that utilizes three-dimensional techniques to pack a large number of FETs in a given area of a semiconductor device, which addresses the scaling problems described above. FinFETs have at least one narrow semiconductor fin that may be as narrow as 10 nm in width. This fin may be gated by electrodes at one or more locations along the length of the fin. Each end of the fin may either make up the source or the drain of the FET. Typically, silicon makes up the semiconductor material of the fin, but other semiconductor materials may be used. Also, gate electrodes may be made of conductors such as polysilicon. A gate oxide layer may insulate the gate electrode from the fin semiconductor material. The gate oxide layer may be much thinner than the gate electrode. The gate oxide may be a dielectric such as $SiO_2$, $HfO_2$, or $Si_3N_4$. In regions where the substrate material is doped, for example P– (for an N– channel FET, an NFET), the source and the drain areas are also doped to become N+ regions, with the P− region under gate electrode serving as a body of the finFET. Gate electrode contacts (contacts), made of a conducting material, may be coupled to each gate electrode to provide signals to the gate electrodes to effectively "turn on" or "turn off" each gate electrode.

FinFETs have significant advantages. Being "three dimensional" FETs, the gate electrode may induce conducting channels on three sides of the fin, increasing current flow through a conducting FET, and making it less necessary that the gate oxide layer be as thin as the gate oxide of a conventional planar FET.

FinFETs may have issues with on-current characteristics and transistor variation due to printing process control. Fins are laid out on a grid to reduce these variations and, as such, may take up more space than intended. Embodiments herein provide for a semiconductor device that has interdigitated fins between existing fins to reduce area requirements for multi-fin devices. Interdigitated fins may increase device on-current characteristics and decrease transistor variations due to fin width.

FIGS. 1-8 show sequential views of exemplary manufacturing stages of an exemplary semiconductor device with finFETs, according to an embodiment. Figures with the same numeric label correspond to the same stage of manufacturing. The figures are not drawn to scale. The dimensions may vary in some embodiments. Also, the shapes of the figures may depict ideal shapes. Variations in actual manufacturing may result in structures deviating from the depicted figures.

Referring to FIG. 1, according to an embodiment, a semiconductor device 100 with fins 110*a* and 110*b* is fabricated according to known techniques. The semiconductor device 100 may include a base 105, a first fin 110*a*, a second fin 110*b*, a first dielectric layer 115, a gate electrode layer 120, a second dielectric layer 125, and a third dielectric layer 130. The first fin 110*a* and the second fin 110*b* may be collectively referred to as fins 110 herein.

As illustrated in FIG. 1, the base 105 may be a bulk semiconductor material. In another embodiment, the base 105 may be a buried oxide on a semiconductor substrate with the semiconductor fins 110*a* and 110*b* on top of the buried oxide (SOI finFET). The buried oxide may be $SiO_2$ or other dielectric. The semiconductor substrate may be single crystal silicon. However, the semiconductor substrate may be other appropriate semiconducting materials, including, but not limited to, SiC, Ge alloys, GaP, InAs, InP, SiGe, GaAs, other III/V or II/VI compound semiconductors, or other crystalline structures.

The first fin 110*a* and second fin 110*b* may be silicon based structures that rise from the substrate of the base 105 and have a doping suitable for a gate body area of a FET (e.g., P-doping, in the case of an NFET). The fins 110 may have a dopant concentration typically in the range from about $5.0*10^{14}/cm^3$ to about $5.0*10^{17}/cm^3$. Besides silicon, the fins 110 may be made of other appropriate semiconducting materials, including, but not limited to, SiC, Ge alloys, GaP, InAs, InP, SiGe, GaAs, other III/V or II/VI compound semiconductors or other crystalline structures. The height of the fins 110 may be in the range from about 10 nm to 1000 nm, although larger or smaller heights are also contemplated. The width of the fins 110 are preferably from 10 nm to 500 nm, although larger or smaller widths are also contemplated. The ratio between the height and width of the fins 110 may be of a ratio of 2:1, although other ratios such as 1:1 and 3:1 are contemplated. Also, the illustration of the fins 110 throughout the figures represents an ideal shape of the fins 110. The fins 110 may be substantially rectangular in shape. However, variations in manufacturing may make the corners of the fins 110 rounded, and the vertical surfaces of the fins 110 may not be parallel with one another or perpendicular to the base 105. Source and drain regions may be appropriately doped in subsequent manufacturing steps to distinguish them from a finFET gate body area.

Covering the fins 110 and base 105 may be a first dielectric layer 115. The first dielectric layer 115 may be $HfO_2$. In other embodiments, other dielectrics may be used such as $SiO_2$ or $Si_3N_4$. The first dielectric layer 115 may be followed by a gate electrode layer 120. While polysilicon is the preferred material for gate electrodes, it will be appreciated that various other gate materials may be substituted for polysilicon. Some non-limiting examples of these materials include tungsten, titanium, tantalum, silicon nitride, silicides such as cobalt or nickel silicides, germanium, silicon germanium, other metals, and various combinations of the foregoing. The gate electrode layer 120 may be followed by an additional gate dielectric, second dielectric layer 125. The second dielectric layer 125 may be $HfO_2$. In other embodiments, other dielectrics may be used such as $SiO_2$ or $Si_3N_4$. On top of the second dielectric layer 120, a third dielectric layer 130 may be deposited. The third dielectric layer 130 may be a different dielectric than that used for the first dielectric 115 and the second dielectric 125. Reasons for this include obtaining different etch rate properties in subsequent manufacturing steps. The third dielectric layer 130 may be $SiO_2$ in an embodiment. In other embodiments, $HfO_2$ or $Si_3N_4$ may be used for example.

Each layer may have various thicknesses. The first dielectric layer 115 and the second dielectric layer 125 may be 1 nm-3 nm in thickness, for example. The third dielectric layer 130 may be sufficiently thick so that it may be used to shape further structures in subsequent manufacturing steps of the semiconductor device 100. The gate electrode layer 120 may be thicker than the thickness of the first dielectric 115 and the second dielectric 125. The thicknesses of the first dielectric layer 115, the second dielectric layer 125, and the gate electrode layer should not be so thick as to fill a span between the two fins 110 with those layers.

Figure 2:
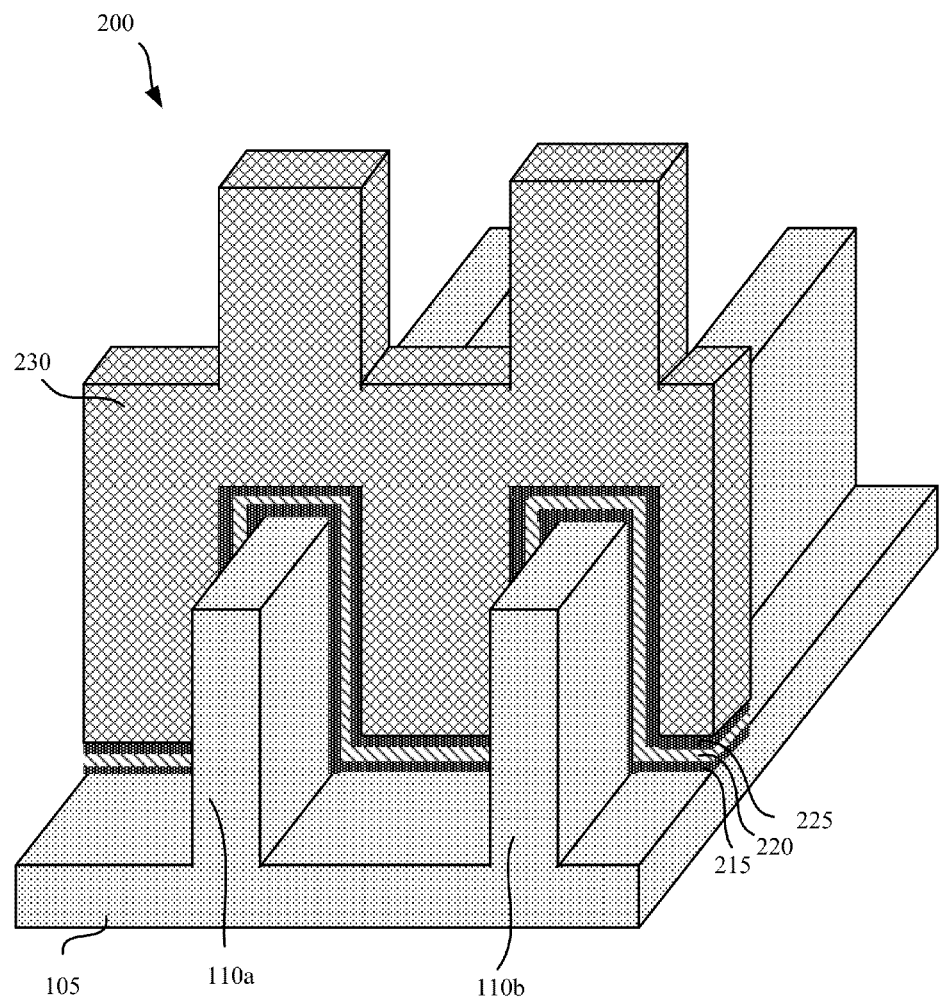

FIG. 2 illustrates an isometric view of the semiconductor device 100 after a mask and an etch of the various dielectrics to define the gate length, according to an embodiment. The semiconductor device 100 of FIG. 1 may be now referred to as semiconductor device 200 after the mask and etch. The third dielectric layer 130 of FIG. 1 may be masked to define the gate length, which may be from 10 nm-200 nm; however, other lengths may be contemplated. After masking the third dielectric layer 130, an anisotropic etch may be performed removing the first dielectric layer 115, the gate electrode layer 120, the second dielectric layer 125, and the third dielectric from a portion of the fins 110. The remaining layers may be referred to now as first dielectric layer 215, the gate electrode layer 220, the second dielectric layer 225, and the third dielectric layer 230. The fins 110 may be exposed on either side of the masked third dielectric layer 230. The exposed regions of the fins 110 may be later defined as source/drain regions. The mask (not shown) may be removed.

Figure 3:
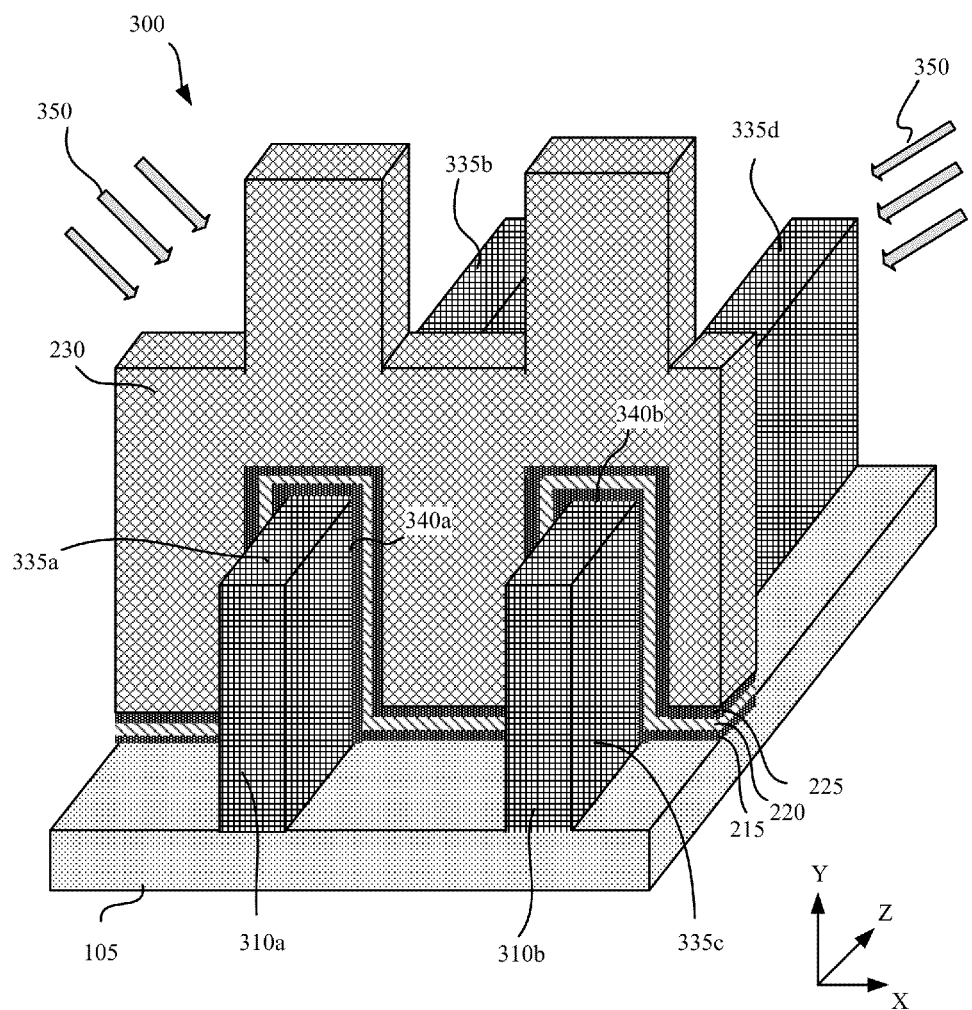

FIG. 3 illustrates an isometric view of the semiconductor device 200 of FIG. 2 after a manufacturing step of angled doping to define the source and drains of the fins 110 of FIG. 2. The semiconductor device 200 may be referred to as semiconductor device 300 after the manufacturing step. Two sufficiently angled dopant implantations 350 may be used to define a first source/drain area 335*a*, a second source/drain area 335*b*, a third source/drain area 335*c*, and a fourth source/drain area 335*d* (collectively referred to as source/drain areas 335) in the semiconductor material of fins 110 of FIG. 2, now referred to as first fin 310*a* and second fin 310*b* and collectively as fins 310. Boron may be a dopant used for pFETs while phosphorus, arsenic, or antimony may be used as a dopant for nFETs. The dopant may be implanted at an angle on the order of about 45 degrees to the x-z plane with the semiconductor device 300 oriented normal to the dopant implantation 350 beam, thereby allowing the third dielectric layer 230 to define a self-aligned first gate body area 340a and a second gate body area 340b (collectively referred to as gate body area 340) between the source/drain areas 335 of each fin 310. The source/drain areas 335 may have a dopant concentration from about $1.0*10^{19}/cm^3$ to about $5.0*10^{21}/cm^3$, and preferably from about $1.0*10^{20}/cm^3$ to about $1.0*10^{21}/cm^3$. However, other dopant concentrations may be considered. The gate body area 340 may retain its doping, which is the complementary doping of the source/drain areas 335 (e.g., P– doping, in the case of an NFET).). The gate body area 340 may have a dopant concentration typically in the range from about $5.0*10^{14}/cm^3$ to about $5.0*10^{17}$. However, other dopant concentrations may be considered. The implanted source/drain areas 340 are activated via rapid thermal anneal or similar activation techniques.

Figure 4:
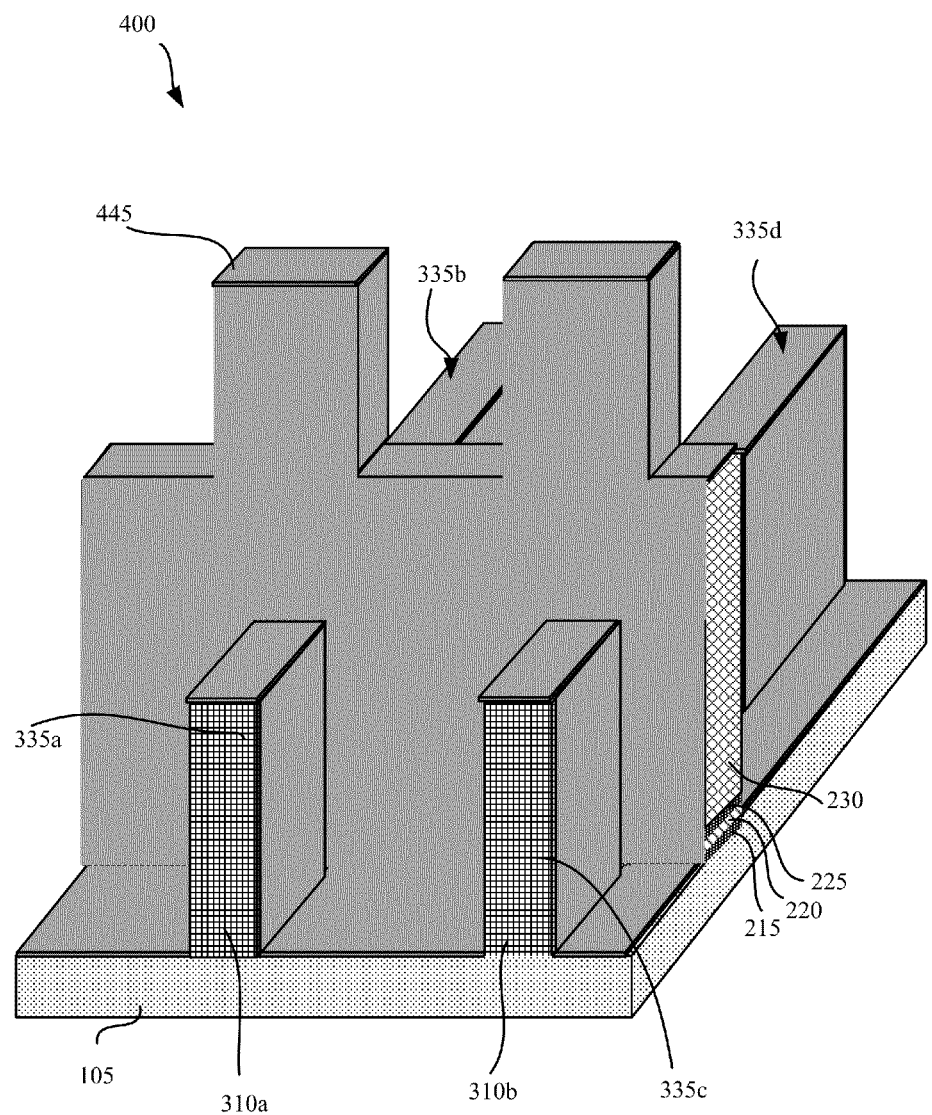

FIG. 4 illustrates an isometric view of the semiconductor device 300 of FIG. 3 after a dielectric spacer 445 is added to all of the surfaces of the semiconductor device 300, according to an embodiment. A dielectric spacer 445 may be added to the surfaces of the semiconductor device 300 of FIG. 3 forming semiconductor device 400. The dielectric spacer 445 may be $HfO_2$; however other dielectrics such as $SiO_2$ or $Si_3N_4$ may be used. The dielectric spacer 445 may be 1 nm-10 nm in thickness, however other thickness may be contemplated. The dielectric spacer 445 may be added by know methods such as vapor deposition.

Figure 5:
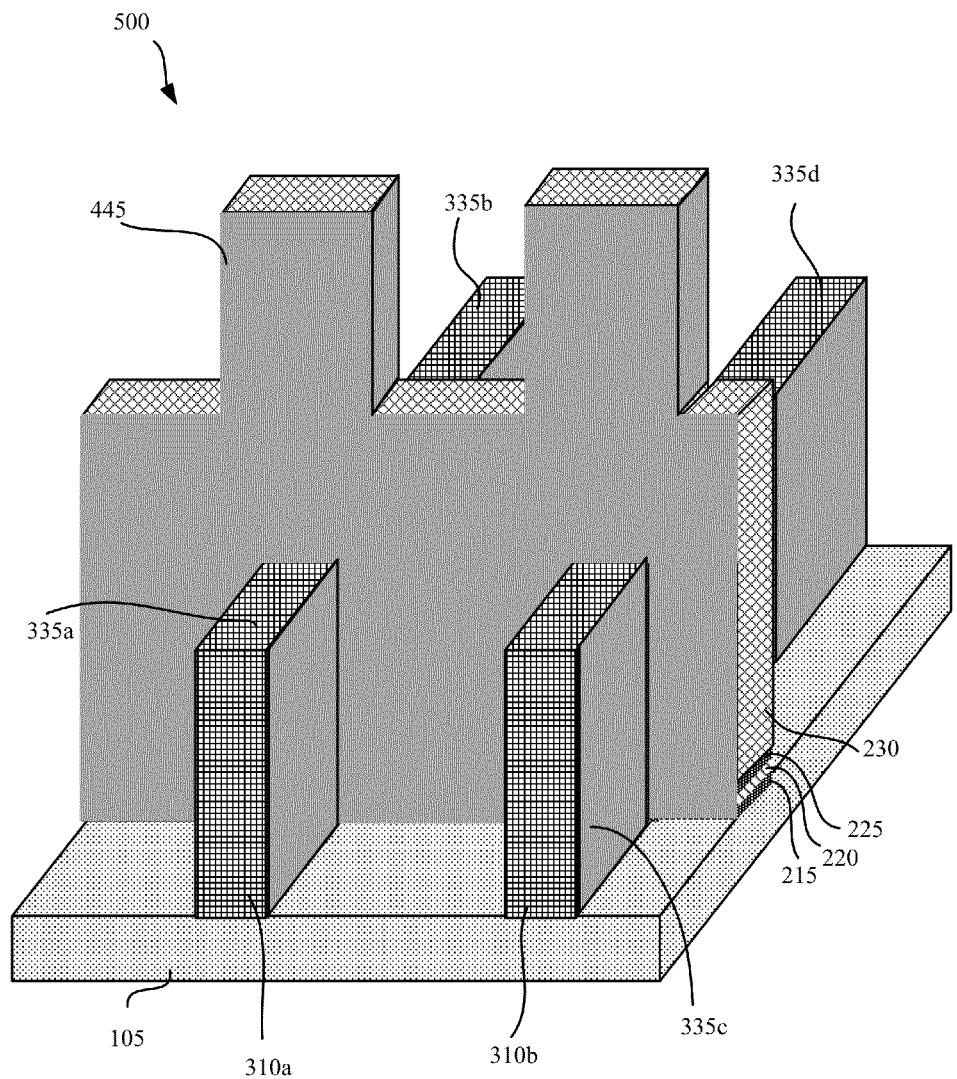

FIG. 5 illustrates an isometric view of the semiconductor device 400 of FIG. 4 after an anisotropic etch of the dielectric spacer 445, according to an embodiment. The dielectric spacer 445, on the horizontal surfaces of the semiconductor device 400 of FIG. 4, may be anisotropically etched away forming semiconductor device 500. The etch may expose the doped semiconductor material of the fins 310 while isolating the gate electrode layer 220 from a subsequent epitaxial growth of the semiconductor material from the fins 310.

Figure 6:
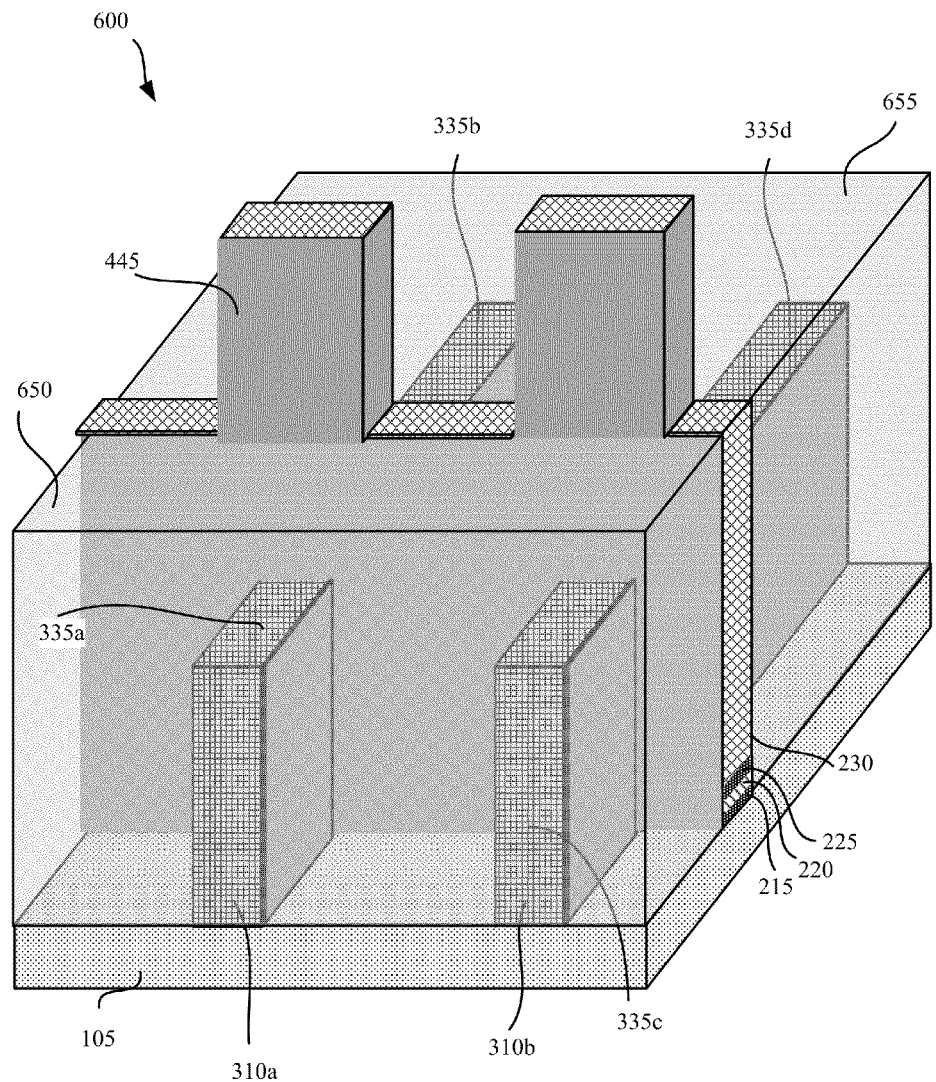

FIG. 6 illustrates an isometric, cutaway view of the semiconductor device 500 of FIG. 5 after forming a fifth source/drain area 650 and a sixth source drain area 655 for an interdigitated finFET, according to an embodiment. A semiconductor material may be epitaxially grown from the exposed doped semiconductor fins 310a and 310b of semiconductor device 500 of FIG. 5 forming semiconductor device 600. The epitaxially growth off the exposed semiconductor material of the fins 310 may pick up the doping characteristics of the doped fins 310 (e.g., N+ doping, in the case of an NFET)

Figure 7:
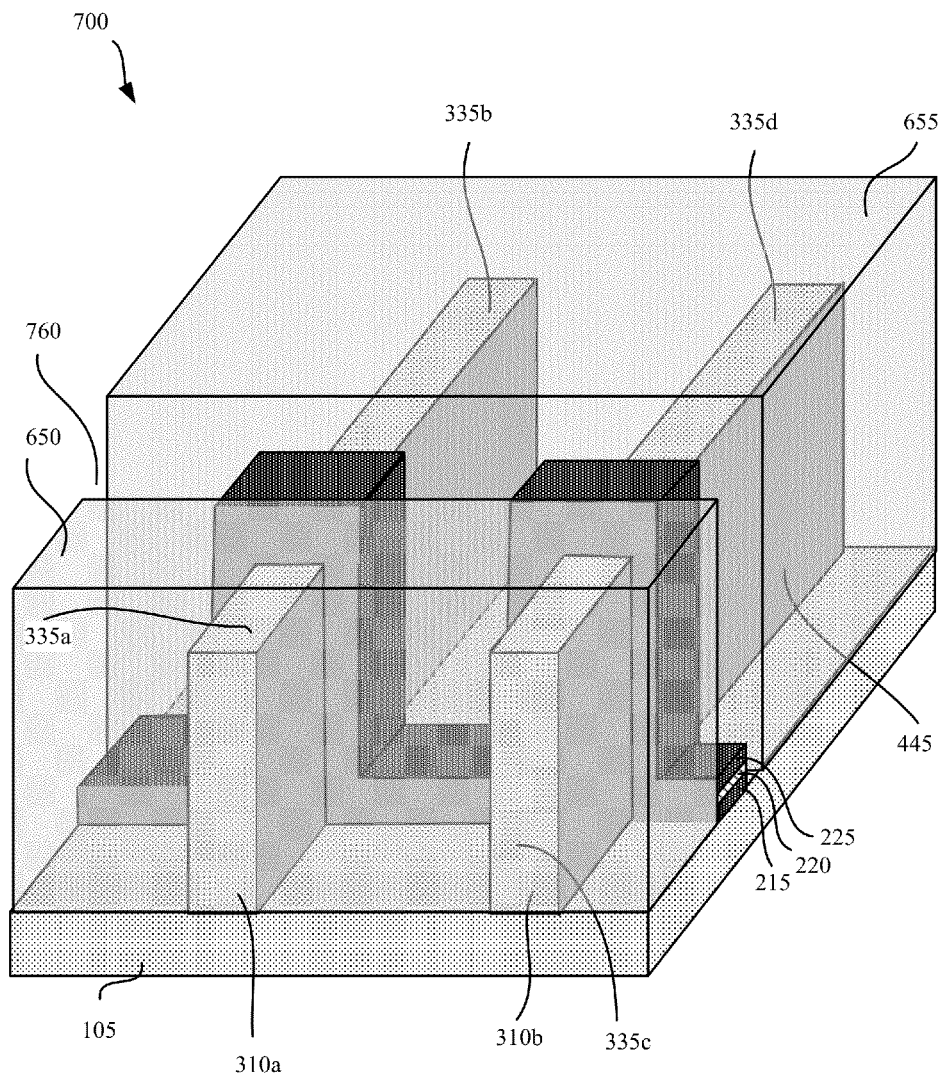

FIG. 7 illustrates an isometric, cutaway view of the semiconductor device 600 of FIG. 6 after forming a trench 760, according to an embodiment. The third dielectric layer 230 and the dielectric spacer 445 on the third dielectric layer 230 on the semiconductor device 600 of FIG. 6 may be etched to the second dielectric 225 forming a semiconductor device 700. The etch forms a trench 760 between the fifth source/drain area 650 and the sixth source/drain area 655. If the second semiconductor layer 225 has a slower etch rate than the third dielectric layer 230 of FIG. 5 (e.g. the ratio of etch rate of $SiO_2$ to $HfO_2$ is approximately 20:1), then the second dielectric layer 225 may slow the etch before the gate electrode layer 220 is exposed. All of the third dielectric layer 230 may be etched away. The etch may leave some spacer dielectric 445 on the faces of the first dielectric layer 215, the gate electrode layer 220, and the second dielectric layer 225 to prevent the gate electrode layer 220 from coming in contact with any of the semiconductor material making up the gate body areas and source/drain areas of the fins 310.

Figure 8:
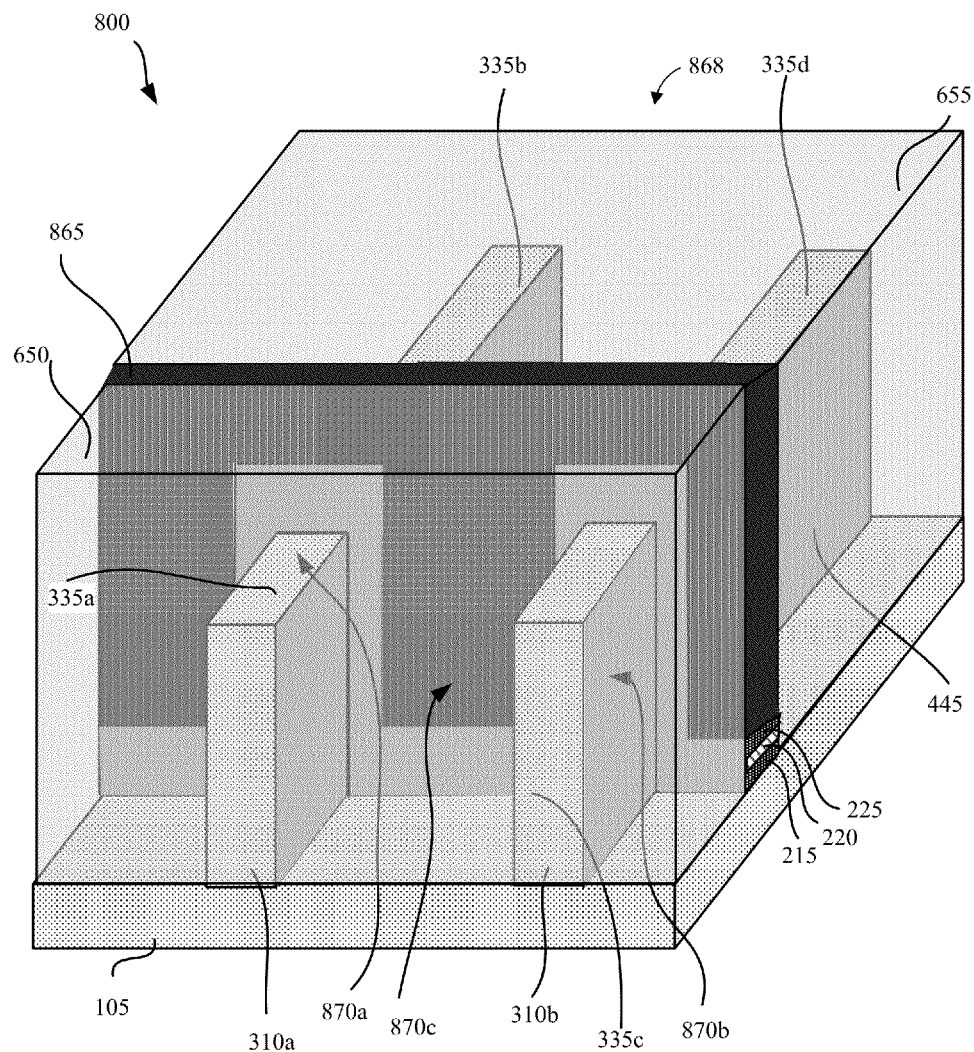

FIG. 8 illustrates an isometric cutaway view of the semiconductor device 700 of FIG. 7 after depositing a third gate body area 865, according to an embodiment. A third gate body area 865 may be a semiconductor material epitaxially grown from the exposed semiconductor material from the fifth source/drain area 650 and the sixth source/drain area 655. The third body 865 area may be complimentary doped to that of the fifth source/drain region 650 and the six source/drain region 655 (e.g. P– for an NFET). The third gate body area 865 may fill the trench 760 with the epitaxially grown semiconductor material. The epitaxial growth of the semiconductor material on the top of the fifth source/drain area 650 and the sixth source/drain area 655 may be planarized (e.g. a chemical mechanical planarization (CMP)) to eliminate a diode formation between the complementary doped semiconductor materials.

The span between the parallel first fin 310a and second fin 310b filled with the fifth source/drain region 650, the sixth source/drain region 655, and the third gate body area 865 may be a third fin 868. The third fin 868 may be interdigitated between the parallel first fin 310a and second fin 310b. A first finFET 870a may include the first fin 310a and the first dielectric layer 215 and gate electrode layer 220 forming a gate of the first finFET 870a. A second finFET 870b may include the second fin 310b and also the same gate as the first finFET 870a. The gate includes the first dielectric layer 215 and the gate electrode layer 220. A third finFET 870c, interdigitated with the first and second finFETs 870a and 870b, may include the third fin 868 with a gate using the same gate electrode layer 220 and the second dielectric layer 225 to form a gate for the third finFET 870c.

Figure 10:
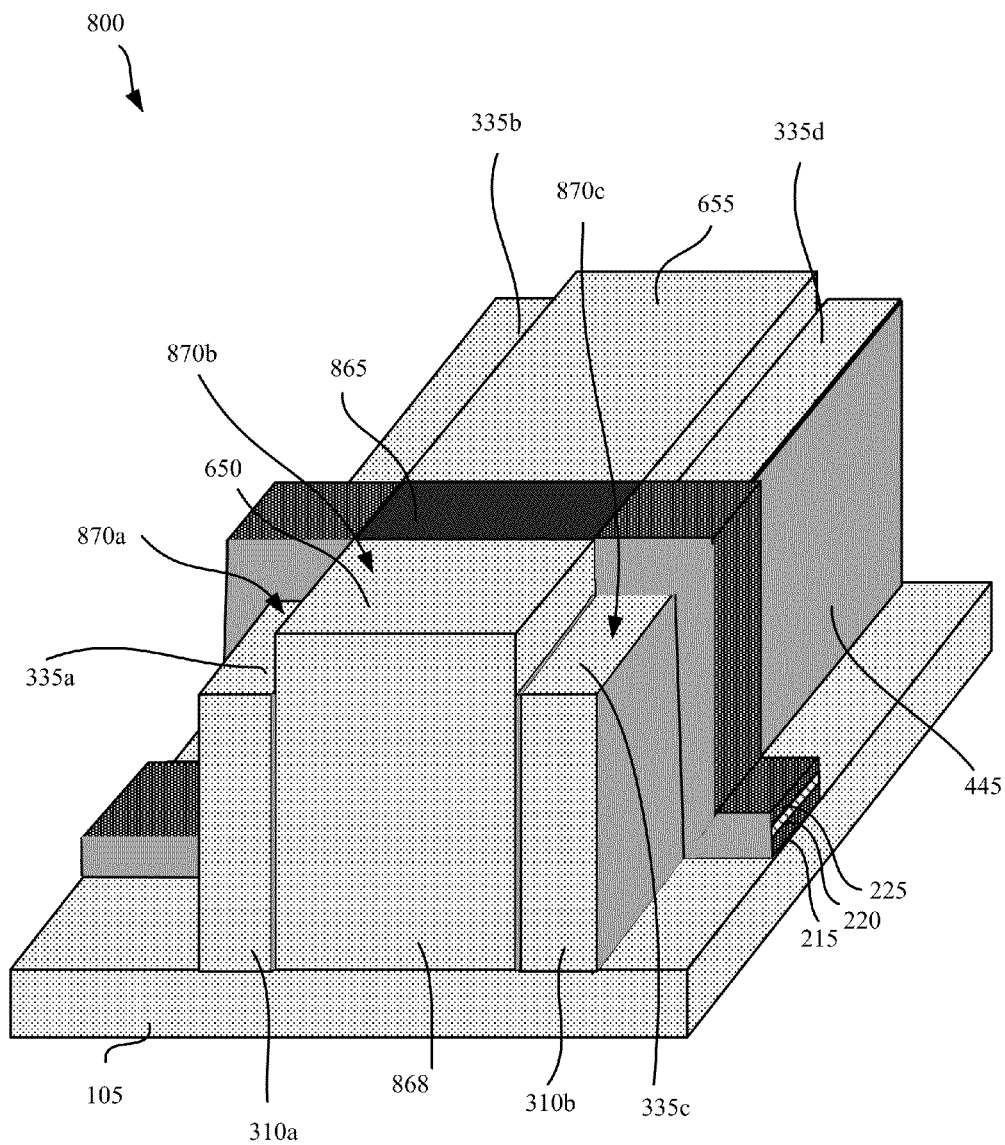
FIG. 10 illustrates an isometric view of the semiconductor device of FIG. 8 to clarify the semiconductor device, according to an embodiment.

The interdigitated finFETs 870a, 870b, and 870c (may collectively be referred to herein as 870) essentially may make three parallel transistors having an identical gate. If the finFETs 870 and the first dielectric layer 215 and the second dielectric layer 225 are identical in dimensions and material, then the current output for the same amount of chip space without the interdigitated third finFET 870c is increased by around 50%. Other advantages besides increase device on-current characteristics include decreasing transistor variations due to fin width and reducing the area requirement of multiple finned devices. For a clearer view of the semiconductor device 800 see FIG. 10. FIG. 10 better illustrates the interdigitated third fin 868 between the first fin 310a and second fin 310b.

Figure 9:
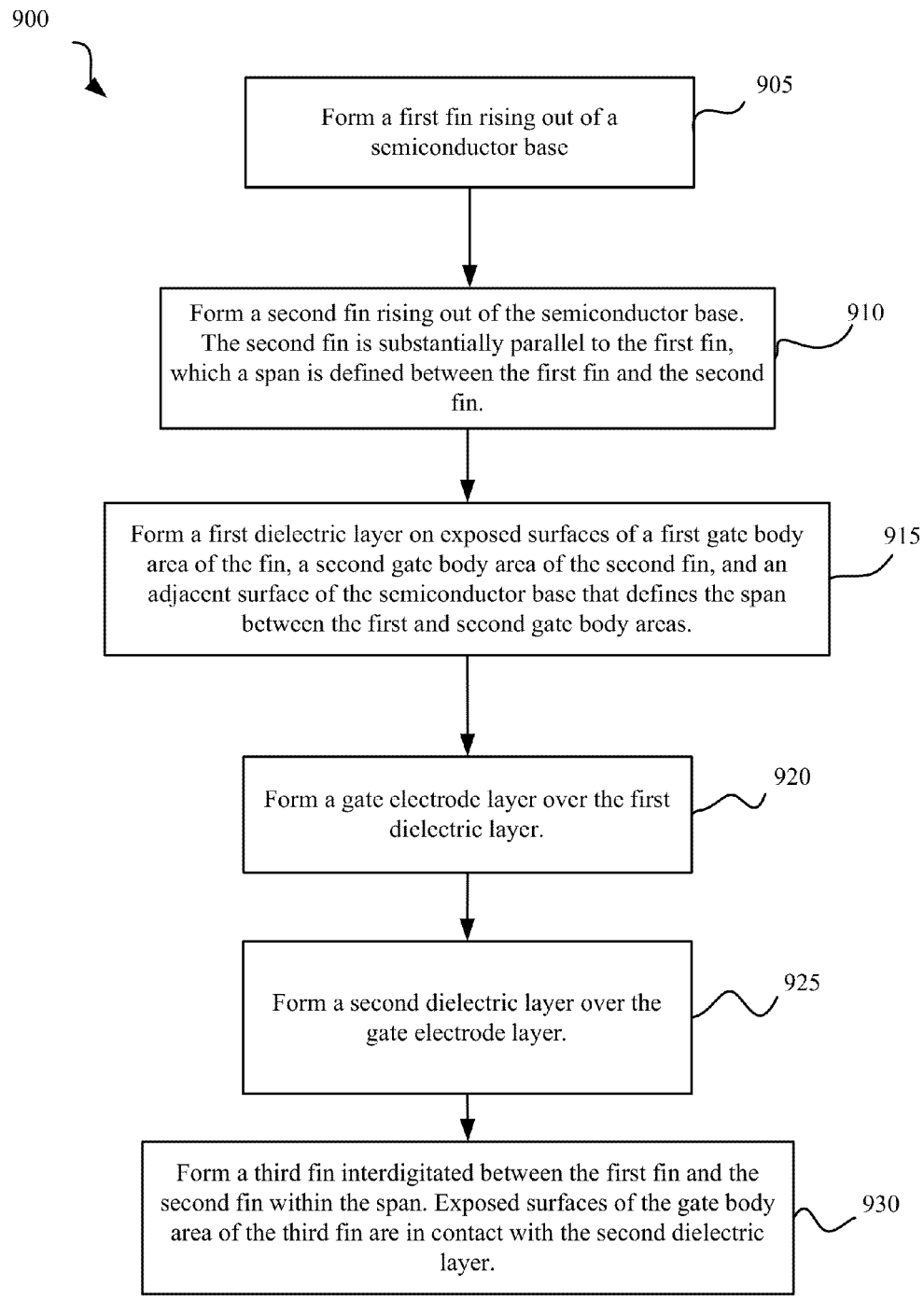
FIG. 9 illustrates a flowchart of a method of manufacturing an interdigitated finFET, according to an embodiment.

FIG. 9 illustrates a flowchart of a method 900 of making the semiconductor device 800, according to an embodiment. In operation 905, the first fin 310a is formed on the semiconductor base 105. In operation 910, the second fin 310b is formed on the semiconductor base 105. The second fin 310b is substantially parallel to the first fin 310a. A span is defined by the area between the two fins. In operation 915, the first dielectric layer 215 is formed on the first gate body area 340a (FIG. 3) of the first fin 310a, on the second gate body area 340b (FIG. 3) of the second fin 310b, and on an adjacent surface of the semiconductor base 105 that defines the span between the first and second gate body areas. In operation 920, the gate electrode layer 220 is formed over the first dielectric layer 215. In operation 925, the second dielectric layer 225 is formed over the gate electrode layer 220. The gate electrode layer 220 is sandwiched between the first dielectric layer 215 and the second dielectric layer 225 In operation 930, the third fin 868 is interdigitated between the first fin

310a and the second fin 310b. Exposed surfaces of the gate body area 865 of the third fin 868 are in contact with the second dielectric layer 225.

While the invention has been described with reference to specific embodiments thereof, those skilled in the art will be able to make various modifications to the described embodiments without departing from the true spirit and scope of the embodiments. The terms and descriptions used herein are set forth by way of illustration only and are not meant as limitations. Those skilled in the art will recognize that these and other variations are possible within the spirit and scope of the embodiments as defined in the following claims and their equivalents.

What is claimed is:

1. A semiconductor device comprising:
    a first fin on a semiconductor base, the first fin having first and second source/drain areas and a first gate body area between the first and second source/drain areas, the first fin having a top side opposite the semiconductor base and a bottom side contacting the semiconductor base, the first fin having first sides of the first and second source/drain areas contacting a first dielectric spacer;
    a second fin on the semiconductor base, the second fin having third and fourth source/drain areas and a second gate body area between the third and fourth source/drain areas, the second fin having a top side opposite the semiconductor base and a bottom side contacting the semiconductor base, the second fin having first sides of the third and fourth source/drain areas opposite the first sides of the first and second source/drain areas contacting a second dielectric spacer, the second fin being substantially parallel to and spaced away from the first fin, the first and second fins defining a span therebetween;
    a third fin on the semiconductor base between the first and second fins, the third fin having fifth and sixth source/drain areas and a third gate body area between the fifth and sixth source/drain areas, the third fin having a top side opposite the semiconductor base and a bottom side contacting the semiconductor base in the fifth and sixth source/drain areas, first sides of the fifth and sixth source/drain areas contacting the first dielectric spacer and second sides of the fifth and sixth source/drain areas contacting the second dielectric spacer,
    a gate electrode substantially perpendicular to the first, second and third fins, the gate electrode having an electrode layer between first and second dielectric layers, the first dielectric layer contacting the semiconductor base in the span, the first dielectric layer contacting the top side of the first fin in the first gate body area, the first dielectric layer contacting the top side of the second fin in the second gate body area, and the second dielectric layer contacting the bottom side of the third fin in the third gate body area in the span.

2. The semiconductor device of claim 1, wherein the first dielectric layer and second dielectric layer are $HfO_2$.

3. The semiconductor device of claim 1, wherein the gate electrode layer is polysilicon.

4. The semiconductor device of claim 1, wherein at least one of the finFETs is an n-type FET (nFET).

5. The semiconductor device of claim 1, wherein at least one of the finFETs is a p-type FET (pFET).

6. The semiconductor device of claim 1, wherein the first dielectric layer and the gate electrode layer forms a gate on the first fin for a first finFET and on the second fin for a second finFET.

7. The semiconductor device of claim 1, wherein the second dielectric layer and the gate electrode layer forms a gate on the third fin for a third finFET.

8. The semiconductor device of claim 1, wherein the first fin, comprises a first gate body area complimentarily doped from and between a first source/drain source area and a second source/drain area.

9. The semiconductor device of claim 1, wherein the second finFET, comprises a second gate body area complimentarily doped from and between a third source/drain source area and a fourth source/drain area.

10. The semiconductor device of claim 1, wherein the third finFET, comprises a third gate body area complimentarily doped and between a fifth source/drain source area and a sixth source/drain area.

11. A method of making a semiconductor device comprising:
    forming a first fin on a semiconductor base, the first fin having first and second source/drain areas and a first gate body area between the first and second source/drain areas, the first fin having a top side opposite the semiconductor base and a bottom side contacting the semiconductor base, the first fin having first sides of the first and second source/drain areas contacting a first dielectric spacer;
    forming a second fin on the semiconductor base, the second fin having third and fourth source/drain areas and a second gate body area between the third and fourth source/drain areas, the second fin having a top side opposite the semiconductor base and a bottom side contacting the semiconductor base, the second fin having first sides of the third and fourth source/drain areas opposite the first sides of the first and second source/drain areas contacting a second dielectric spacer, the second fin being substantially parallel to and spaced away from the first fin, the first and second fins defining a span therebetween;
    forming a third fin on the semiconductor base between the first and second fins, the third fin having fifth and sixth source/drain areas and a third gate body area between the fifth and sixth source/drain areas, the third fin having a top side opposite the semiconductor base and a bottom side contacting the semiconductor base in the fifth and sixth source/drain areas, first sides of the fifth and sixth source/drain areas contacting the first dielectric spacer and second sides of the fifth and sixth source/drain areas contacting the second dielectric spacer,
    forming a gate electrode substantially perpendicular to the first, second and third fins, the gate electrode having an electrode layer between first and second dielectric layers, the first dielectric layer contacting the semiconductor base in the span, the first dielectric layer contacting the top side of the first fin in the first gate body area, the first dielectric layer contacting the top side of the second fin in the second gate body area, and the second dielectric layer contacting the bottom side of the third fin in the third gate body area in the span.

12. The method of claim 11, wherein the first dielectric layer and second dielectric layer are $HfO_2$.

13. The method of claim 11, wherein the gate electrode layer is polysilicon.

14. The method of claim 11, wherein at least one of the finFETs is an n-type FET (nFET).

15. The method of claim 11, wherein at least one of the finFETs is a p-type FET (pFET).

16. The method of claim 11, wherein the first dielectric layer and the gate electrode layer forms a gate on the first fin for a first finFET and on the second fin for a second finFET.

17. The method of claim 11, wherein the second dielectric layer and the gate electrode layer forms a gate on the third fin for a third finFET.

18. The method of claim 11, wherein the first fin, comprises a first gate body area complimentarily doped from and between a first source/drain source area and a second source/drain area.

19. The method of claim 11, wherein the second finFET, comprises a second gate body area complimentarily doped from and between a third source/drain source area and a fourth source/drain area.

20. The method of claim 11, wherein the third finFET, comprises a third gate body area complimentarily doped and between a fifth source/drain source area and a sixth source/drain area.

* * * * *